(12) United States Patent
Kato et al.

(10) Patent No.: US 6,590,010 B2
(45) Date of Patent: Jul. 8, 2003

(54) ORGANOSILOXANE POLYMER, PHOTO-CURABLE RESIN COMPOSITION, PATTERNING PROCESS, AND SUBSTRATE PROTECTIVE COATING

(75) Inventors: Hideto Kato, Matsuida-machi (JP); Takafumi Ueda, Matsuida-machi (JP); Tomoyoshi Furihata, Matsuida-machi (JP)

(73) Assignee: Shin-Etsu Chemicals, Co., Ltd. (JP)

( * ) Notice: Subject to any disclaimer, the term of this patent is extended or adjusted under 35 U.S.C. 154(b) by 114 days.

(21) Appl. No.: 09/949,848

(22) Filed: Sep. 12, 2001

(65) Prior Publication Data

US 2002/0055550 A1 May 9, 2002

(30) Foreign Application Priority Data

Sep. 12, 2000 (JP) .................................... 2000-276897

(51) Int. Cl.$^7$ .................. C08G 77/00; C08G 77/12; C08F 2/46; C08F 2/50
(52) U.S. Cl. .................. 522/148; 522/172; 522/31; 525/100; 525/101; 525/474; 525/472; 525/479; 525/477; 525/476; 525/478; 524/861; 524/862; 526/279; 526/280; 526/281; 526/282; 526/284; 427/508; 427/510; 427/515; 427/541
(58) Field of Search .................. 522/148, 172, 522/31; 427/508, 510, 515, 541; 430/270.1, 280.1; 525/100, 101, 474, 472, 479, 477, 476, 478, 10, 20, 25, 29; 526/279, 280, 281, 282, 284; 524/861, 862; 428/411.1, 446, 447

(56) References Cited

U.S. PATENT DOCUMENTS

| | | | |
|---|---|---|---|
| 3,781,378 A | | 12/1973 | Kantor et al. .................. 260/84 |
| 4,064,027 A | * | 12/1977 | Gant .......................... 522/172 |
| 4,161,405 A | * | 7/1979 | Crivello ................... 430/280.1 |
| 4,922,113 A | | 5/1990 | Melancon ................... 250/372 |
| 4,978,731 A | | 12/1990 | Melancon et al. ............. 528/15 |
| 5,073,595 A | * | 12/1991 | Almer et al. .................. 525/65 |
| 5,087,670 A | * | 2/1992 | Melancon et al. ....... 525/326.2 |
| 5,206,312 A | * | 4/1993 | Liao et al. .................. 525/474 |
| 5,243,009 A | * | 9/1993 | Rich et al. ..................... 528/26 |
| 5,248,838 A | * | 9/1993 | Massirio et al. ............ 568/727 |
| 5,270,116 A | * | 12/1993 | Melancon et al. .......... 428/447 |
| 5,310,604 A | * | 5/1994 | Melancon et al. .......... 428/447 |
| 5,318,827 A | * | 6/1994 | Logan et al. ................ 428/212 |
| 5,486,577 A | * | 1/1996 | Farah et al. ................. 525/469 |
| 5,502,139 A | * | 3/1996 | Toh et al. .................... 526/284 |
| 5,504,177 A | * | 4/1996 | King et al. .................... 528/29 |
| 5,516,877 A | * | 5/1996 | Bales et al. ................. 528/198 |
| 5,552,224 A | * | 9/1996 | Laughner et al. ........... 428/401 |
| 6,153,663 A | * | 11/2000 | Chen et al. ................. 522/181 |
| 6,297,300 B1 | * | 10/2001 | Van Nuffel .................. 524/91 |

FOREIGN PATENT DOCUMENTS

| | | | | |
|---|---|---|---|---|
| EP | 1186624 A1 | * | 3/2002 | ........... C08G/77/48 |
| JP | 55-105627 | | 8/1980 | |
| JP | 59-500522 | | 3/1984 | |
| JP | 4-136860 | | 5/1992 | |
| JP | 11199663 A | | 7/1999 | |

OTHER PUBLICATIONS

Kossmehl G. et al.: "Liquid–Crystalline Polysiloxanes with Fluorene Units, and Related Monomeric Compounds" Macromolecular Chemistry and Physics, vol. 191 No. 12, Dec. 1, 1990.
Patent Abstracts of Japan, vol. 1999, No. 12, Oct. 29, 1999.
Abstract of Japanese 55–105627.
Abstract of Japanese 59–500522.
Abstract of Japanese 4–136860.

\* cited by examiner

*Primary Examiner*—James J. Seidleck
*Assistant Examiner*—Sanza L McClendon
(74) *Attorney, Agent, or Firm*—Millen, White, Zelano & Branigan, P.C.

(57) ABSTRACT

By blending novel organosiloxane polymers of the invention with a crosslinking agent and a photoacid generator, photo-curable resin compositions are formulated which can be exposed to radiation in a broad wavelength range and readily form a thin film without oxygen attack. From the compositions, fine patterns having improved dry etching resistance can be formed. Cured coatings of the compositions having improved substrate adhesion, heat resistance, and electrical insulation are suitable as a protective film for electric and electronic parts.

4 Claims, No Drawings

ORGANOSILOXANE POLYMER, PHOTO-CURABLE RESIN COMPOSITION, PATTERNING PROCESS, AND SUBSTRATE PROTECTIVE COATING

This invention relates to organosiloxane polymers, photo-curable resin compositions comprising the same, patterning process, and substrate protective coatings.

BACKGROUND OF THE INVENTION

Organosiloxane base photo-curable resin compositions find routine use as protective coatings, insulating coatings and strippable coatings and are also used as photoresist materials for micropatterning.

Organosiloxane base photo-curable resin compositions known in the art include such compositions using photoacid generators. For example, epoxy group-containing organosiloxane base resin compositions using diaryl iodonium salts as the photoacid generator are known from JP-A 55-105627, and vinyl ether group-containing organosiloxane base resin compositions using onium salts as the photoacid generator are disclosed in JP-A 59-500522.

In these resin compositions, however, the type of photoacid generator which can be used is limited because of the poor compatibility of the resin with the photoacid generator, giving rise to the problem that the composition can be utilized with only a light source of limited wavelength. When the resin compositions are used as resist material for micropatterning, the resin is insufficiently photo-curable to form a finely defined pattern.

One known resist material for micropatterning is a resin composition comprising a cresol-novolac resin or polyhydroxystyrene resin, an alkoxymethylated amino resin and a photoacid generator (JP-A 4-136860). Regrettably, the resist formed from this resin composition has poor resistance to oxygen dry etching. Also, when such a resin composition is used as a protective insulating material for a substrate, the composition has an essential problem of poor adhesion to the substrate.

SUMMARY OF THE INVENTION

An object of the invention is to provide a novel organosiloxane polymer, a photo-curable resin composition comprising the same which can be exposed to radiation in a broad wavelength range and readily form a thin film without oxygen attack, a patterning process capable of forming a fine pattern having improved dry etching resistance, and a substrate protective coating having a high dielectric strength and improved substrate adhesion.

It has been found that a photo-curable resin composition comprising an organosiloxane polymer comprising recurring units of the general formula (1) shown below and having a weight average molecular weight of 500 to 200,000 can be exposed to radiation in a broad wavelength range and a thin film can be readily formed therefrom without oxygen attack or interference. Using the composition, a fine pattern having improved dry etching resistance can be formed by a patterning process to be described below. Additionally, a cured coating obtained from the composition by the patterning process has improved adhesion to substrates, heat resistance, and electrically insulating properties.

In a first aspect, the invention provides an organosiloxane polymer comprising recurring units of the following general formula (1) and having a weight average molecular weight of 500 to 200,000.

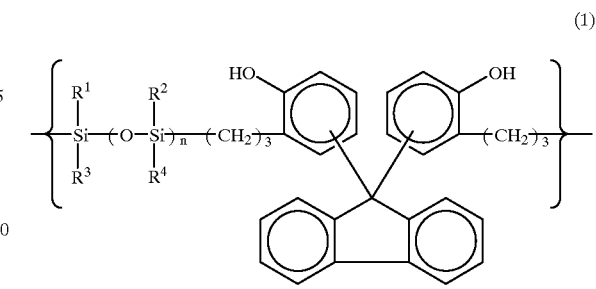

(1)

Herein $R^1$ to $R^4$ are independently selected from monovalent hydrocarbon groups having 1 to 8 carbon atoms, and n is an integer of 1 to 1000.

In a second aspect, the invention provides a photo-curable resin composition comprising (A) the organosiloxane polymer defined above, (B) at least one compound selected from among amino condensates modified with formalin or formalin-alcohol, phenol compounds having on the average at least two methylol or alkoxymethylol groups in a molecule, and epoxy compounds having on the average at least two epoxy groups in a molecule, and (C) a photoacid generator.

In a third aspect, the invention provides a patterning process comprising the steps of (i) applying the photocurable resin composition defined above onto a substrate to form a coating, (ii) exposing the coating to radiation having a wavelength of 150 to 450 nm through a photomask, and (iii) developing the exposed coating with a developer.

A substrate protective coating obtained by post-curing the coating patterned by the above process is also contemplated.

DESCRIPTION OF THE PREFERRED EMBODIMENTS

According to the invention, the organosiloxane polymer or high molecular weight compound is defined as comprising recurring units of the following general formula (1) and having a weight average molecular weight of 500 to 200,000.

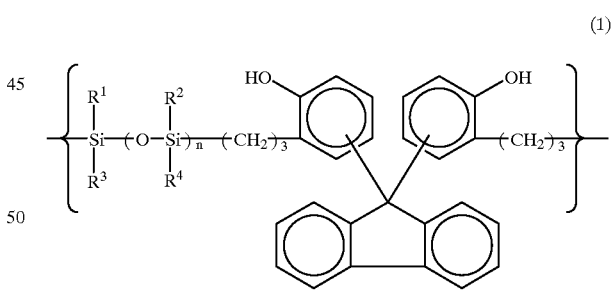

(1)

Herein $R^1$ to $R^4$, which may be the same or different, each are a monovalent hydrocarbon group having 1 to 8 carbon atoms, preferably 1 to 6 carbon atoms. Examples include straight, branched or cyclic alkyl groups such as methyl, ethyl, propyl, isopropyl, n-butyl, tert-butyl, and cyclohexyl, straight, branched or cyclic alkenyl groups such as vinyl, allyl, propenyl, butenyl, hexenyl and cyclohexenyl, aryl groups such as phenyl and tolyl, and aralkyl groups such as benzyl and phenylethyl.

The letter n is an integer of 1 to 1000 and preferably 1 to 100. With n in excess of 1000, the polymer becomes less compatible with components (B) and (C) of the composition so that the composition may become less photo-curable.

The organosiloxane polymer should have a weight average molecular weight Mw of 500 to 200,000, and preferably 1,000 to 100,000. With Mw of less than 500, the polymer is less photo-curable. With Mw in excess of 200,000, the polymer becomes less compatible with components (B) and (C) of the composition.

The organosiloxane polymer of the invention can be prepared, for example, by effecting polymerization reaction, known as "hydrosilylation," of a specific phenol compound having allyl groups represented by the following formula (2) with an organohydrosiloxane of the following formula (3) in the presence of a catalyst.

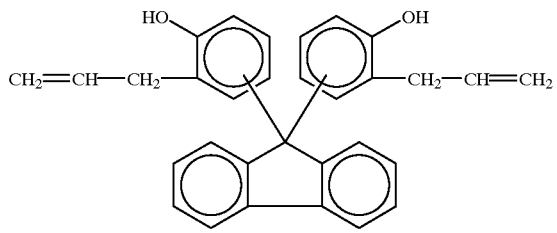

(2)

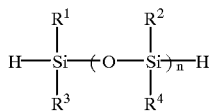

(3)

Herein $R^1$ to $R^4$ and n are as defined above. The organohydrosiloxane of formula (3) is obtainable as a desired oligomer or prepolymer by subjecting a corresponding organohydrosiloxane monomer to condensation reaction under appropriate conditions.

It is understood that the weight average molecular weight Mw of the organosiloxane polymer comprising recurring units of formula (1) can be readily controlled by adjusting the ratio of the total number of allyl groups in the phenol compound of formula (2) to the total number of hydrosilyl groups in the organohydrosiloxane of formula (3), to be referred to as "total allyl/total hydrosilyl ratio." Accordingly, in the above polymerization reaction, the phenol compound (2) and the organohydrosiloxane (3) may be used in such amounts as to give a sufficient total allyl/total hydrosilyl ratio to afford a desired Mw. Specifically, an appropriate total allyl/total hydrosilyl ratio to form an organosiloxane polymer with a Mw of 500 to 200,000 is between 0.5 and 2, and especially between 0.8 and 1.2. It is then recommended that the phenol compound (2) and the organohydrosiloxane (3) be used in such amounts as to give a total allyl/total hydrosilyl ratio within this range.

Examples of the catalyst used in the above polymerization reaction include platinum group metals such as platinum (including platinum black), rhodium, and palladium; platinum chloride, chloroplatinic acid and chloroplatinic acid salts such as $H_2PtCl_4 \cdot nH_2O$, $H_2PtCl_6 \cdot nH_2O$, $NaHPtCl_6 \cdot nH_2O$, $KHPtCl_6 \cdot nH_2O$, $Na_2PtCl_6 \cdot nH_2O$, $K_2PtCl_4 \cdot nH_2O$, $PtCl_4 \cdot nH_2O$, $PtCl_2$, and $Na_2HPtCl_4 \cdot nH_2O$ wherein n is an integer of 0 to 6, especially 0 or 6; alcohol-modified chloroplatinic acid (U.S. Pat. No. 3,220,972); complexes of chloroplatinic acid with olefins (U.S. Pat. Nos. 3,159,601, 3,159,662 and 3,775,452); platinum group metals on carriers such as platinum black and palladium on alumina, silica and carbon; rhodium-olefin complexes; chlorotris(triphenylphosphine)rhodium known as Wilkinson catalyst; and complexes of platinum chloride, chloroplatinic acid or chloroplatinic acid salts with vinyl-containing siloxanes, especially vinyl-containing cyclic siloxanes.

If desired, an organic solvent is used in the above polymerization reaction. The preferred organic solvents are hydrocarbon solvents such as toluene and xylene.

Preferred polymerization conditions include a temperature of 40 to 150° C., and especially 80 to 120° C. At a too low temperature, the polymerization may take a longer time until completion. Too high a temperature can deactivate the catalyst.

The polymerization time depends on the type and amount of a polymer to be formed. Preferably polymerization is completed within 0.5 to 10 hours, and especially within 0.5 to 5 hours, in order to prevent moisture entry into the polymerization system. Since organohydrosiloxanes tend to induce disproportionation reaction as side reaction and hydrosilylation polymerization reaction is generally exothermic, it is recommended to add the organohydrosiloxane (3) dropwise.

After the polymerization reaction is completed in this way, the solvent, if any, is distilled off, yielding an organosiloxane polymer comprising recurring units of formula (1) according to the invention.

In the second aspect, the photo-curable resin composition includes (A) the organosiloxane polymer comprising recurring units of formula (1), (B) at least one compound selected from among amino condensates modified with formalin or formalin-alcohol, phenol compounds having on the average at least two methylol or alkoxymethylol groups in a molecule, and epoxy compounds having on the average at least two epoxy groups in a molecule, and (C) a photoacid generator.

Component (B) is a crosslinking agent which undergoes curing reaction with component (A) for thereby augmenting the strength of a cured product. The resin used as component (B) should preferably have a weight average molecular weight Mw of about 200 to 5,000, and more preferably about 300 to 3,000. A resin (B) with Mw of less than 200 may fail to provide a sufficient photo-cure ability whereas a resin (B) with Mw in excess of 5,000 may be less compatible with the organosiloxane polymer (A).

The amino condensates modified with formalin or formalin-alcohol as component (B) include melamine condensates modified with formalin or formalin-alcohol, and urea condensates modified with formalin or formalin-alcohol.

The modified melamine condensates are prepared, for example, by modifying a melamine monomer with formalin into a methylol form in a well-known manner, and optionally, further modifying it with an alcohol into an alkoxy form, thereby yielding a modified melamine of the formula (4) shown below. The alcohols used herein are lower alcohols, for example, alcohols having 1 to 4 carbon atoms.

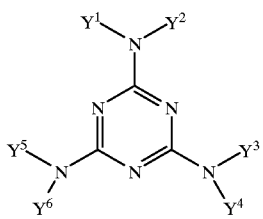

(4)

Herein, $Y^1$ to $Y^6$, which may be the same or different, each are a methylol group, an alkoxymethyl group containing an alkoxy portion of 1 to 4 carbon atoms, or hydrogen, and at least one of $Y^1$ to $Y^6$ is a methylol or alkoxymethyl group. Illustratively, $Y^1$ to $Y^6$ each are a methylol group, an alkoxymethyl group such as methoxymethyl or ethoxymethyl, or hydrogen.

Illustrative, non-limiting, examples of the modified melamine of formula (4) include trimethoxymethylmonomethylolmelamine, dimethoxymethylmonomethylolmelamine, trimethylolmelamine, hexamethylolmelamine, and hexamethoxymethylolmelamine.

Next, the modified melamine of formula (4) or an oligomer thereof (e.g., dimer or trimer) is subjected to addition condensation polymerization with formaldehyde until a desired molecular weight is reached, thereby obtaining the formalin or formalin-alcohol-modified melamine condensate as component (B). One or more modified melamine condensates may be used as component (B).

Also, the urea condensates modified with formalin or formalin-alcohol are prepared, for example, by modifying a urea condensate having a desired molecular weight with formalin into a methylol form in a well-known manner, and optionally, further modifying it with an alcohol into an alkoxy form.

Illustrative examples of the modified urea condensate include methoxymethylated urea condensates, ethoxymethylated urea condensates, and propoxymethylated urea condensates. One or more modified urea condensates may be used as component (B).

Another component (B) is a phenol compound having on the average at least two methylol or alkoxymethylol groups in a molecule, examples of which include (2-hydroxy-5-methyl)-1,3-benzenedimethanol and 2,2',6,6'-tetramethoxymethylbisphenol A.

A further component (B) is an epoxy compound having on the average at least two epoxy groups in a molecule, examples of which include bisphenol type epoxy resins such as bisphenol A type epoxy resins and bisphenol F type epoxy resins, novolac type epoxy resins such as phenol novolac type epoxy resins and cresol novolac type epoxy resins, triphenolalkane type epoxy resins and polymers thereof, biphenyl type epoxy resins, dicyclopentadiene-modified phenol novolac type epoxy resins, phenolaralkyl type epoxy resins, biphenylaralkyl type epoxy resins, naphthalene ring-containing epoxy resins, glycidyl ester type epoxy resins, alicyclic epoxy resins, and heterocyclic epoxy resins.

As component (B), the amino condensates, phenol compounds and epoxy compounds may be used alone or in admixture of any.

An appropriate amount of the amino condensate, phenol compound or epoxy compound used as component (B) is about 1 to 50 parts, and especially about 1 to 30 parts by weight per 100 parts by weight of the organosiloxane polymer (A). Less than 1 part of component (B) may fail to provide a satisfactory cure ability upon light exposure whereas more than 50 parts of component (B) may lead to a lower proportion of siloxane bonds in the photo-curable resin composition, which cures into a product with least of the desired effects.

The photoacid generator (C) is typically a compound which upon light exposure, generates an acid serving as a curing catalyst. Since the resin composition of the invention is highly compatible with the photoacid generator, the photoacid generator may be selected from a wide variety of such compounds. Typical photoacid generators include onium salts, diazomethane derivatives, glyoxime derivatives, β-ketosulfone derivatives, disulfone derivatives, nitrobenzyl sulfonate derivatives, sulfonic acid ester derivatives, imidoyl sulfonate derivatives, oxime sulfonate derivatives, and triazine derivatives.

Exemplary onium salts are compounds of the following general formula (5).

(5)

In the formula, $R^5$ is a straight, branched or cyclic alkyl of 1 to 12 carbon atoms, an aryl of 6 to 12 carbon atoms, or an aralkyl of 7 to 12 carbon atoms, which may have a substituent; $M^+$ is iodonium or sulfonium; $K^-$ is a non-nucleophilic counter-ion; and the letter a is 2 or 3.

Illustrative examples of alkyl groups represented by $R^5$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl.

Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Exemplary diazomethane derivatives are compounds of the following general formula (6).

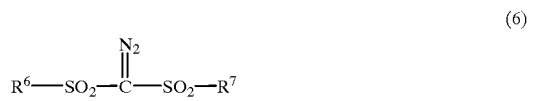

(6)

In the formula, $R^6$ and $R^7$, which may be the same or different, are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^6$ and $R^7$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

Exemplary glyoxime derivatives are compounds of the following general formula (7).

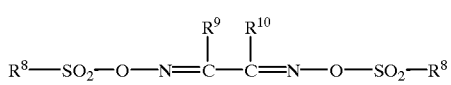

(7)

In the formula, $R^8$ to $R^{10}$, which may be the same or different, are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^9$ and $R^{10}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^8$ to $R^{10}$ are exemplified by the same groups as mentioned above for $R^6$ and $R^7$. Examples of alkylene groups represented by $R^9$ and $R^{10}$ include methylene, ethylene, propylene, butylene, and hexylene.

Illustrative examples of the photoacid generator (C) include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate and diphenyl(4-thiophenoxyphenyl)sulfonium hexafluoroantimonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propyl-sulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluene-sulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoro-ethanesulfonyl)-α-dimethylglyoxime, bis-O-(tert-butane-sulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

oxime sulfonate derivatives such as α-(benzenesulfoniumoxyimino)-4-methylphenylacetonitrile;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butane-sulfonyl)-α-dimethylglyoxime. These photoacid generators may be used singly or in combinations of two or more thereof.

The photoacid generator (C) is preferably added in an amount of about 0.1 to 20 parts by weight, and especially about 0.5 to 5 parts by weight, per 100 parts by weight of the organosiloxane polymer (A). Less than 0.1 part of the photoacid generator may fail to provide a satisfactory photo-cure ability whereas more than 20 parts of the photoacid generator can exacerbate the photo-curing of a thick film due to the light absorption of the photoacid generator itself.

An organic solvent may be blended in the photo-curable resin composition of the invention, if necessary. The organic solvent used herein may be any organic solvent in which the organosiloxane polymer (A), component (B) and photoacid generator (C) and other components are soluble.

Illustrative, non-limiting, examples of the organic solvent include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof.

Of the above organic solvents, preferred are diethylene glycol dimethyl ether and 1-ethoxy-2-propanol, in which the photoacid generator is most soluble, and propylene glycol monomethyl ether acetate and ethyl lactate which are safe, and mixtures thereof.

An appropriate amount of the organic solvent used is about 50 to 2,000 parts, and especially about 100 to 1,000 parts by weight per 100 parts by weight of all solids. With less than 50 parts of the organic solvent, components (A) to (C) may become insufficiently compatible. With more than 2,000 parts of the organic solvent, little further improvement is made in compatibility and the composition having a too low viscosity may become difficult to apply.

In addition to the aforementioned components, the photo-curable resin composition of the invention may include optional components. For example, there may be added a surfactant which is commonly used for improving the coating characteristics. Preferred are nonionic surfactants, for example, fluorochemical surfactants such as perfluoroalkyl polyoxyethylene ethanols, fluorinated alkyl esters, perfluoroalkylamine oxides, and fluorinated organosiloxane compounds.

These surfactants are commercially available. Illustrative examples include Florade FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Another component which can be added herein is a light absorber for improving the light absorption efficiency of the photoacid generator. Exemplary light absorbers include diaryl sulfoxides, diaryl sulfones, 9,10-dimethylanthracene and 9-fluorenone. Besides, other optional components which are commonly used in conventional resist materials can be added when the photo-curable resin composition of the invention is used as a resist.

These optional components may be added in conventional amounts so long as this does not compromise the objects of the invention.

The photo-curable resin composition of the invention is prepared in a conventional way. For example, it can be prepared by agitating and mixing the aforementioned components and optionally, organic solvent and additives and passing the mixture through a filter to remove solids, if necessary.

The photo-curable resin composition thus prepared is useful as protective coatings, insulating coatings and strippable coatings and can also be employed as a photoresist material for microfabrication.

When a pattern is formed using the photo-curable resin composition, the patterning process involves the steps of (i) applying the photo-curable resin composition onto a substrate to form a coating, (ii) exposing the coating to radiation having a wavelength of 150 to 450 nm through a photomask, and (iii) developing the exposed coating with a developer.

More particularly, the photo-curable resin composition is first applied onto a substrate. The substrate may be a silicon wafer or quartz substrate, for example. The application may employ well-known techniques complying with lithography. For example, the composition is applied by dipping, spin coating and roll coating. The coverage may be determined as appropriate for a particular purpose although a coating thickness of 0.1 to 100 $\mu$m is often preferred.

In order that effective photo-curing reaction take place, the solvent may be previously evaporated off by preheating, if necessary. The preheating is, for example, at about 40 to 140° C. for about 1 to 10 minutes.

Then the coating is exposed to radiation having a wavelength of 150 to 450 nm through a photomask for effecting photo-curing reaction. The photomask used herein may be a member in which a desired pattern has been cut out. The photomask is preferably made of a material capable of shielding the radiation having a wavelength of 150 to 450 nm, for example, chromium.

Examples of the radiation having a wavelength of 150 to 450 nm include radiation of various wavelengths generated by radiation-emitting units, for example, UV radiation (e.g., g-line and i-line), deep UV radiation (248 nm, 198 nm), and electron beams. An appropriate exposure dose is 10 to 500 mJ/cm$^2$, but not limited thereto.

If desired for increasing the development sensitivity, the cured coating may be heat treated. Such post-curing heat treatment is effected, for example, at about 40 to 140° C. for about ½ to 10 minutes.

Following the curing, the coating is developed with a developer. The developer is preferably any of customarily used organic solvents, for example, isopropyl alcohol.

Development is effected in a conventional manner, for example, by immersing the cured coating in the developer. The development is followed by washing and drying if necessary. There is obtained a cured coating having the desired pattern.

Although the pattern forming process has been described, it is sometimes unnecessary to form a pattern. When it is simply desired to form a uniform thin film, for example, the same process as above may be followed except that the photomask is not used.

The photo-cured pattern obtained by the above process may be utilized as a mask for processing the substrate. Because of the inclusion of siloxane bonds, the pattern is fully resistant to oxygen plasma and thus best suited as a mask against oxygen plasma etching.

If desired, the pattern may be heated in an oven or hot plate at about 150 to 250° C. for about 10 minutes to about 2 hours for increasing the crosslinking density and removing the residual volatile matter. Then a coating having augmented adhesion to substrates, heat resistance, high strength and good electrical properties can be formed.

Since the cured coating obtained from the photo-curable resin composition in the above-described way has improved substrate adhesion, heat resistance and electrical insulation, it may be advantageously used as a protective coating on electric and electronic parts and semiconductor devices.

EXAMPLE

Examples of the invention are given below by way of illustration and not by way of limitation. All parts are by weight.

Synthesis Example 1

A flask equipped with a stirrer, thermometer, nitrogen purging line and reflux condenser was charged with 43.0 g of 4,4'-(9H-fluoren-9-ylidene)bis[(2-propenyl)phenol], 60 g of toluene and 0.1 g of chloroplatinic acid and heated at 80° C.

Then 13.4 g of 1,3-dihydro-1,1,3,3-tetramethyldisiloxane was added dropwise to the flask. After the dropwise addition, the reaction solution was ripened for one hour at 100° C. whereupon the toluene was distilled off. The series of steps yielded 54 g of a solid product.

On IR analysis, the product was found to have no absorption peaks attributable to hydrosilyl and allyl groups, indicating the completion of hydrosilylation reaction. An absorption peak attributable to siloxane bond was observed at 1050 cm$^{-1}$. The product had a weight average molecular weight of 18,000, as measured by GPC using a polystyrene standard.

From the above structural analysis, it was confirmed to be an organosiloxane polymer having recurring units shown below.

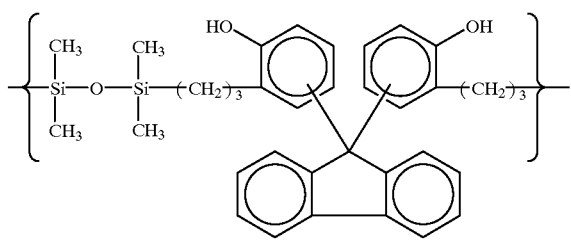

Synthesis Example 2

The procedure of Synthesis Example 1 was repeated aside from using 41.8 g of 4,4'-(9H-fluoren-9-ylidene)bis[(2-propenyl)phenol] and 196.0 g of a dihydrosiloxane wherein 20% of $R^1$ to $R^4$ are phenyl and 80% are methyl and n is 19 instead of the 1,3-dihydro-1,1,3,3-tetramethyldisiloxane. There was obtained 230 g of a liquid product.

On structural analysis as in Synthesis Example 1, it was confirmed to be an organosiloxane polymer having recurring units shown below and a weight average molecular weight of 40,000.

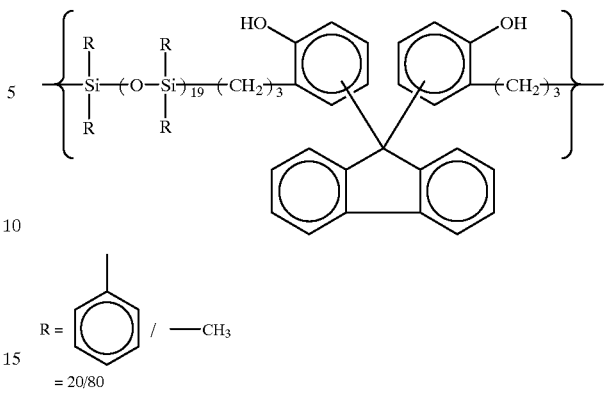

Synthesis Example 3

The procedure of Synthesis Example 1 was repeated aside from using 3.1 g of 4,4'-(1-methylethylidene)bis[(2-propenyl) phenol] instead of the 4,4'-(9H-fluoren-9-ylidene) bis[(2-propenyl)phenol] and 889 g of a dihydroxymethylpolysiloxane wherein n is 1,200 instead of the 1,3-dihydro-1,1,3,3-tetramethyldisiloxane. There was obtained 891 g of a liquid product.

On structural analysis as in Synthesis Example 1, it was confirmed to be an organosiloxane polymer having recurring units shown below and a weight average molecular weight of 280,000.

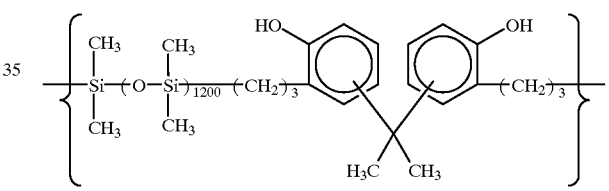

Example 1

A photo-curable resin composition was prepared by blending the organosiloxane polymer obtained in Synthesis Example 1, an amino condensate as a crosslinking agent, a photoacid generator, organic solvent and additive according to the formulation shown in Table 1, agitating and mixing them, and passing the mixture through a Teflon filter to remove the solid matter.

By a spin coating technique, the photo-curable resin composition was applied onto three silicon wafers to a thickness of 1 μm and 10 μm.

The coatings were heated and dried at 80° C. for one minute for removing the solvent. The coated substrates were exposed to radiation having a wavelength shown in Table 1 in a dose shown in Table 1. After the exposure, the substrates were heated at 60° C. for one minute and then cooled.

The coated substrates were immersed in isopropyl alcohol for one minute for development. There were obtained cured coatings having a good retentivity as shown in Table 1.

Example 2

A photo-curable resin composition was prepared by blending the organosiloxane polymer obtained in Synthesis Example 1, tetramethoxymethylolbisphenol A as a crosslinking agent, a photoacid generator, solvent and additive according to the formulation shown in Table 1, agitating and mixing them, and passing the mixture through a Teflon filter to remove the solid matter.

Substrates were coated with the composition and exposed to radiation as in Example 1 except that a photomask having a stripe pattern was used upon exposure.

The coated substrates were developed in acetone. The unexposed areas were dissolved in acetone, leaving a definite stripe pattern having a line width substantially equal to the coating thickness. The cured coatings had a good retentivity as shown in Table 1.

Example 3

A photo-curable resin composition was prepared by blending the organosiloxane polymer obtained in Synthesis Example 2, an epoxy compound as a crosslinking agent, and a photoacid generator according to the formulation shown in Table 1, agitating and mixing them, and passing the mixture through a Teflon filter to remove the solid matter.

Substrates were coated with the composition and exposed to radiation as in Example 1 except that a photomask having a stripe pattern was used upon exposure.

The coated substrates were developed in acetone. The unexposed areas were dissolved in acetone, leaving a definite stripe pattern having a line width substantially equal to the coating thickness. The cured coatings had a good retentivity as shown in Table 1.

Comparative Example 1

A photo-curable resin composition was prepared as in Example 1 except that the organosiloxane polymer obtained in Synthesis Example 3 instead of the organosiloxane polymer obtained in Synthesis Example 1, an amino condensate as a crosslinking agent, and a photoacid generator were blended according to the formulation shown in Table 1.

The composition was coated, exposed to radiation and developed as in Example 1 except that the coated substrates were not heat dried prior to exposure. The results are also shown in Table 1.

The photoacid generators I, II and III used herein have the following structure.

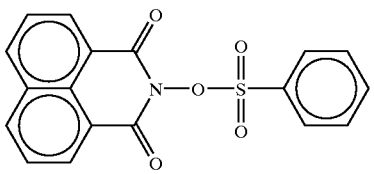

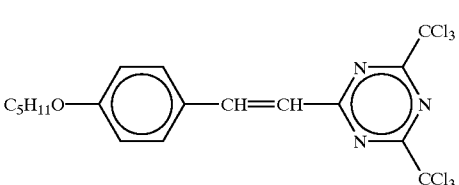

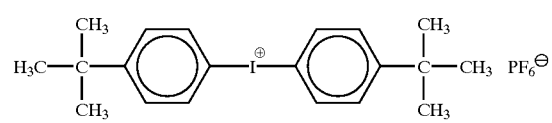

The patterned cured coatings each were post-cured by holding in a drier at 180° C. for one hour. The adhesion of the coating to the substrate after post-curing was examined by a scribed peel test. The substrates tested were a silicon nitride film and copper.

As demonstrated in Table 1, all the cured coatings of Examples 1 to 3 were tightly adherent to the substrates, indicating that the cured compositions of the invention are useful as a protective film on electronic parts.

Using the novel organosiloxane polymers of the invention, photo-curable resin compositions are formulated which can be exposed to radiation in a broad wavelength range and readily form a thin film without oxygen attack. From the compositions, fine patterns having improved dry etching resistance can be formed. Cured coatings of the compositions have improved substrate adhesion, heat resistance, and electrical insulation and are suitable as a

TABLE 1

| | Composition (pbw) | | | | Light source/ dose | Retentivity after development | Resolution | Substrate adhesion after post-curing |
|---|---|---|---|---|---|---|---|---|
| | Organo-siloxane polymer | Crosslinking agent | Photoacid generator | Other additives | | | | |
| Example 1 | Synthesis Example 1 (100 parts) | hexamethoxy-methylol-melamine (10 parts) | I (1 part) | ethyl lactate (150 parts) FC-430 (0.001 part) | 365 nm 150 mJ/cm² | 100% at 1 µm 98% at 10 µm | 1.5 µm L/S at 1 µm 8 µm L/S at 10 µm | No peel |
| Example 2 | Synthesis Example 1 (100 parts) | tetramethoxy-methylol-bisphenol A (20 parts) | II (1 part) | cyclohexanone (150 parts) X-70-093 (0.001 part) | 436 nm 150 mJ/cm² | 100% at 1 µm 100% at 10 µm | 2 µm L/S at 1 µm 15 µm L/S at 10 µm | No peel |
| Example 3 | Synthesis Example 2 (100 parts) | N, N-diglycidyl-4-glycidyloxy-aniline (15 parts) | III (0.5 part) | — | 248 nm 100 mJ/cm² | 100% at 1 µm 95% at 10 µm | 3 µm L/S at 1 µm 20 µm L/S at 10 µm | No peel |
| Comparative Example 1 | Synthesis Example 3 (100 parts) | hexamethoxy-methylol-melamine (10 parts) | I (1 part) | — | 365 nm 150 mJ/cm² | 0% at 1 µm 0% at 10 µm | — | — | protective film for electric and electronic parts, semiconductor devices and the like.

Japanese Patent Application No. 2000-276897 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An organosiloxane polymer comprising recurring units of the following general formula (1) and having a weight average molecular weight of 500 to 200,000,

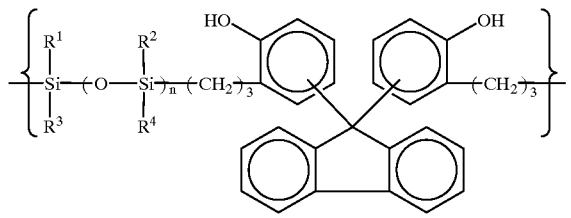

(1)

wherein $R^1$ to $R^4$ each are a monovalent hydrocarbon group having 1 to 8 carbon atoms, and n is an integer of 1 to 1000.

2. A photo-curable resin composition comprising (A) the organosiloxane polymer of claim 1, (B) at least one compound selected from the group consisting of an amino condensate modified with formalin or formalin-alcohol, a phenol compound having on the average at least two methylol or alkoxymethylol groups in a molecule, and an epoxy compound having on the average at least two epoxy groups in a molecule, and (C) a photoacid generator.

3. A patterning process comprising the steps of:

(i) applying the photo-curable resin composition of claim 2 onto a substrate to form a coating, (ii) exposing the coating to radiation having a wavelength of 150 to 450 nm through a photomask, and (iii) developing the exposed coating with a developer.

4. A substrate protective coating obtained by post-curing the coating patterned by the process of claim 3.

* * * * *